United States Patent
Seo et al.

(10) Patent No.: US 9,330,745 B2
(45) Date of Patent: May 3, 2016

(54) MAGNETIC MEMORY DEVICES INCLUDING MAGNETIC MEMORY CELLS HAVING OPPOSITE MAGNETIZATION DIRECTIONS

(71) Applicants: Bo-Young Seo, Suwon-si (KR); Yong-Kyu Lee, Gwacheon-si (KR); Choong-Jae Lee, Hwaseong-si (KR); Hee-Seog Jeon, Suwon-si (KR)

(72) Inventors: Bo-Young Seo, Suwon-si (KR); Yong-Kyu Lee, Gwacheon-si (KR); Choong-Jae Lee, Hwaseong-si (KR); Hee-Seog Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/509,756

(22) Filed: Oct. 8, 2014

(65) Prior Publication Data

US 2015/0179244 A1 Jun. 25, 2015

(30) Foreign Application Priority Data

Dec. 24, 2013 (KR) .................. 10-2013-0162589

(51) Int. Cl.
*G11C 11/16* (2006.01)
(52) U.S. Cl.
CPC .................. *G11C 11/161* (2013.01)
(58) Field of Classification Search
CPC .................. G11C 11/1675; G11C 13/0069
USPC .................................. 365/158, 148
See application file for complete search history.

(56) References Cited

U.S. PATENT DOCUMENTS

| | | | |
|---|---|---|---|
| 6,278,631 B1 * | 8/2001 | Naji | G11C 11/16 365/158 |
| 6,421,271 B1 | 7/2002 | Gogl et al. | |
| 6,445,613 B1 | 9/2002 | Nagai | |
| 6,803,618 B2 | 10/2004 | Honigschmid et al. | |
| 6,816,405 B1 | 11/2004 | Lu et al. | |
| 6,891,748 B2 | 5/2005 | Tsuchida et al. | |
| 7,075,818 B2 * | 7/2006 | Ju | G11C 11/16 365/158 |
| 7,195,929 B2 | 3/2007 | Park et al. | |
| 7,577,020 B2 | 8/2009 | Chung et al. | |
| 7,613,868 B2 | 11/2009 | Yang et al. | |
| 7,821,819 B2 * | 10/2010 | Hachino | G11C 11/15 365/158 |
| 8,120,949 B2 * | 2/2012 | Ranjan | G11C 11/15 365/148 |
| 8,934,288 B2 * | 1/2015 | Oh | G11C 11/161 365/148 |

(Continued)

FOREIGN PATENT DOCUMENTS

| | | |
|---|---|---|
| JP | 2006-186109 | 7/2006 |
| KR | 1020060012402 | 2/2006 |

*Primary Examiner* — Michael Tran
(74) *Attorney, Agent, or Firm* — Myers Bigel & Sibley, PA

(57) ABSTRACT

A magnetic memory device includes first and second magnetic memory cells coupled to first and second bit lines, respectively. The first and second magnetic memory cells respectively include a pinned magnetic layer, a free magnetic layer, and a tunnel insulating layer therebetween. Respective stacking orders of the pinned magnetic layer, the tunnel insulating layer, and the free magnetic layer are different in the first and second magnetic memory cells. The magnetic memory device further includes at least one transistor that is configured to couple the first and second magnetic memory cells to a common source line. Related methods of operation are also discussed.

18 Claims, 9 Drawing Sheets

(56) References Cited

U.S. PATENT DOCUMENTS

| | | | |
|---|---|---|---|
| 2002/0018360 A1 | 2/2002 | Hartmann | |
| 2005/0068806 A1* | 3/2005 | Hurst | G11C 11/15 365/173 |
| 2005/0094445 A1* | 5/2005 | Lu | G11C 11/16 365/199 |
| 2006/0202244 A1* | 9/2006 | Ju | H01L 27/226 257/295 |
| 2007/0091672 A1* | 4/2007 | Lin | G11C 11/16 365/158 |
| 2008/0273369 A1* | 11/2008 | Angerbauer | G11C 11/5614 365/148 |
| 2009/0046501 A1* | 2/2009 | Ranjan | G11C 11/15 365/171 |
| 2009/0103354 A1 | 4/2009 | Yoon et al. | |
| 2010/0002492 A1 | 1/2010 | Kajiyama | |
| 2010/0238718 A1 | 9/2010 | Asao | |
| 2011/0044096 A1* | 2/2011 | Li | G11C 11/16 365/158 |
| 2012/0281461 A1 | 11/2012 | Asao | |
| 2013/0028015 A1 | 1/2013 | Matsui | |

\* cited by examiner

|  | BL1 | | BL2 | | WL | | SL | |
|---|---|---|---|---|---|---|---|---|
|  | Select | Unselect | Select | Unselect | Select | Unselect | Select | Unselect |
| WRITE "1" | Vwrite | 0V | Vwrite | 0V | VDD | 0V | 0V | 0V |
| WRITE "0" | 0V | 0V | 0V | 0V | VDD | 0V | Vwrite | 0V |
| READ | Vread | 0V | Vread | 0V | VDD | 0V | 0V | 0V |

FIG. 7

|  | BL1 | | BL2 | | WL | | SL | |
|---|---|---|---|---|---|---|---|---|
|  | Select | Unselect | Select | Unselect | Select | Unselect | Select | Unselect |
| WRITE "1" | Vwrite | Vfloat | Vwrite | Vfloat | VDD | 0V | 0V | 0V |
| WRITE "0" | 0V | Vfloat | 0V | Vfloat | VDD | 0V | Vwrite | 0V |
| READ | Vread | 0V | Vread | 0V | VDD | 0V | 0V | 0V |

MAGNETIC MEMORY DEVICES INCLUDING MAGNETIC MEMORY CELLS HAVING OPPOSITE MAGNETIZATION DIRECTIONS

CROSS-REFERENCE TO RELATED APPLICATIONS

This application is based on and claims priority from Korean Patent Application No. 10-2013-0162589, filed on Dec. 24, 2013 in the Korean Intellectual Property Office, the disclosure of which is incorporated herein in its entirety by reference.

BACKGROUND

The present inventive concepts relate to memory devices, and more particularly, to magnetic memory devices.

A DRAM (Dynamic Random Access Memory) may offer advantages such as higher operating speeds and lower power consumption, but may also have disadvantages in that it is a volatile memory that may lose stored data when power is lost or turned off. A flash memory device may offer advantages in that it is a nonvolatile memory that may not lose stored data even if power is lost or turned off, can be miniaturized, and may have higher access speeds. However, flash memory devices may have disadvantages such as lower operating speeds and higher operating voltage.

Various memory devices offering such advantages of DRAM and flash memory have been developed. One example of such memory devices is a magnetic memory device or a magnetic random access memory. The magnetic memory device is a memory device which operates based on a change of a resistance state according to a magnetization direction of a magnetic body, and may offer advantages such as improved safety.

SUMMARY

Embodiments of the present inventive concepts may provide memory devices having improved operating speed.

Additional advantages, subjects, and features of the inventive concepts will be set forth in part in the description which follows and in part will become apparent to those having ordinary skill in the art upon examination of the following or may be learned from practice of the inventive concepts.

According to some embodiments of the present inventive concepts, a magnetic memory device includes first and second magnetic memory cells coupled to first and second bit lines, respectively. The first and second magnetic memory cells respectively include a pinned magnetic layer, a free magnetic layer, and a tunnel insulating layer therebetween. Respective stacking orders of the pinned magnetic layer, the tunnel insulating layer, and the free magnetic layer are different in the first and second magnetic memory cells. The magnetic memory device further includes at least one transistor is configured to couple the first and second magnetic memory cells to a common source line.

In some embodiments, the first and second magnetic memory cells may have different resistances. A comparison of the different resistances may be indicative of binary data stored in the first and second memory cells.

In some embodiments, the free magnetic layer of the first magnetic memory cell and the free magnetic layer of the second magnetic memory cell may have opposite magnetization directions responsive to application of a same voltage to the first and second bit lines.

In some embodiments, the pinned magnetic layer of the first and second magnetic memory cells may have a same magnetization direction.

In some embodiments, the at least one transistor may be a single transistor. The first and second magnetic memory cells may be coupled to a drain region of the single transistor, and the common source line may be coupled to a source region of the single transistor.

In some embodiments, the at least one transistor may be first and second transistors having a common source region. The first and second magnetic memory cells may be coupled to respective drain regions of the first and second transistors, respectively, and the common source line may be coupled to the common source region.

According to some further embodiments of the present inventive concepts, there is provided a magnetic memory device comprising: a first bit line and a second bit line disposed to be adjacent to the first bit line; a first word line crossing the first and second bit lines; a first magnetic memory cell disposed in a cross region of the first bit line and the first word line; and a second magnetic memory cell disposed in a cross region of the second bit line and the first word line, wherein each of the first and second magnetic memory cells includes a first magnetic layer, a tunnel insulating layer, and a second magnetic layer, and stacking orders of the first magnetic layer, the tunnel insulating layer, and the second magnetic layer are different from each other in the first and second magnetic memory cells.

According to still further embodiments of the present inventive concepts, there is provided a magnetic memory device comprising: first and second bit lines disposed to be adjacent to each other; a first word line crossing the first and second bit lines; a first magnetic memory cell disposed in a cross region of the first bit line and the first word line, and including a first magnetic layer, a tunnel insulating layer, and a second magnetic layer, which are successively stacked; a second magnetic memory cell disposed in a cross region of the second bit line and the first word line, and including the second magnetic layer, the tunnel insulating layer, and the first magnetic layer, which are successively stacked; and a source line electrically connected to the first and second magnetic memory cells, wherein magnetization directions of the second magnetic layer of the first magnetic memory cell and the second magnetic layer of the second magnetic memory cell are different from each other.

BRIEF DESCRIPTION OF THE DRAWINGS

The above and other objects, features and advantages of the present inventive concepts will be more apparent from the following detailed description taken in conjunction with the accompanying drawings, in which:

FIG. 7 is a table illustrating operating voltages of the magnetic memory device 2 of FIG. 5;

DETAILED DESCRIPTION OF THE EMBODIMENTS

Figure 1:
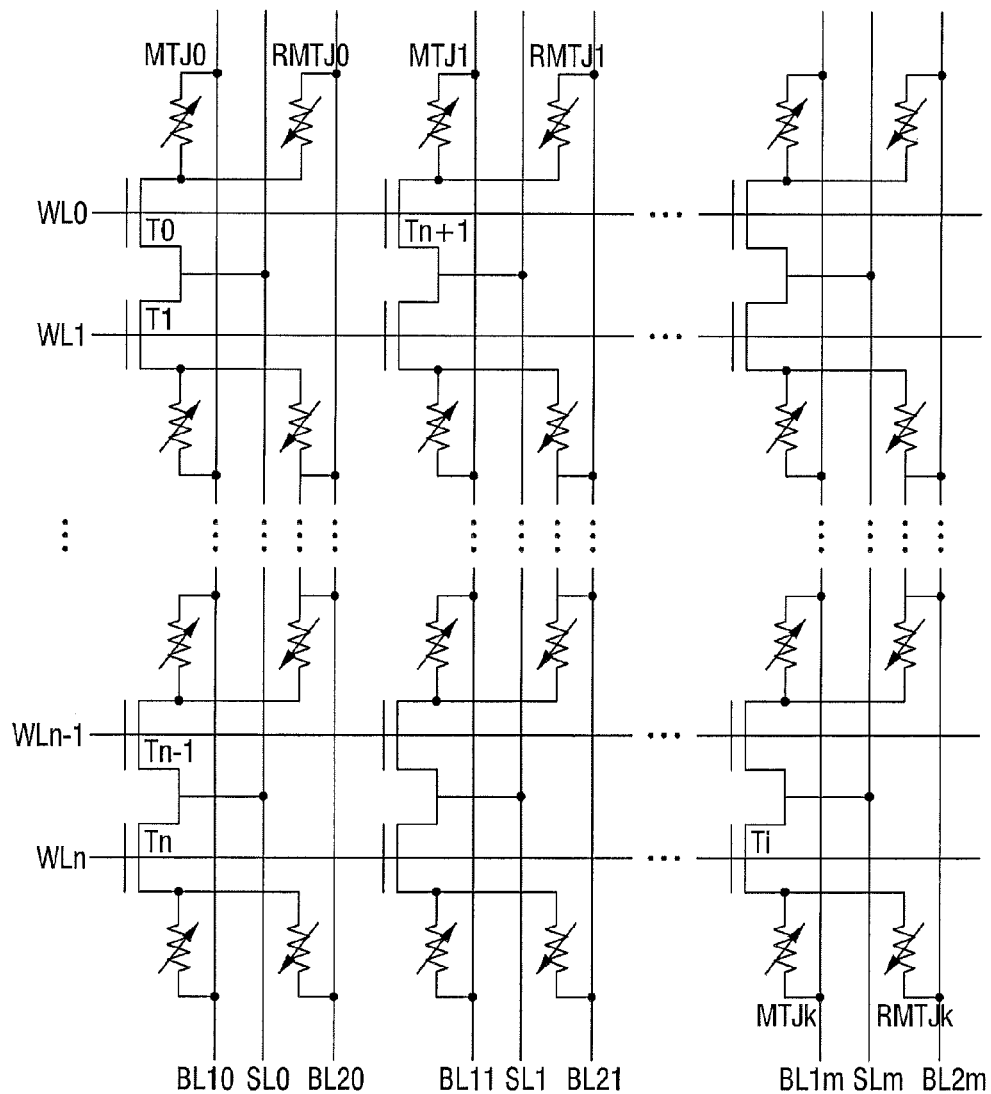
FIG. 1 is an equivalent circuit diagram of a magnetic memory device 1 according to some embodiments of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a magnetic memory device 1 according to some embodiments of the present inventive concepts will be described with reference to FIGS. 1 to 4.

Figure 2:
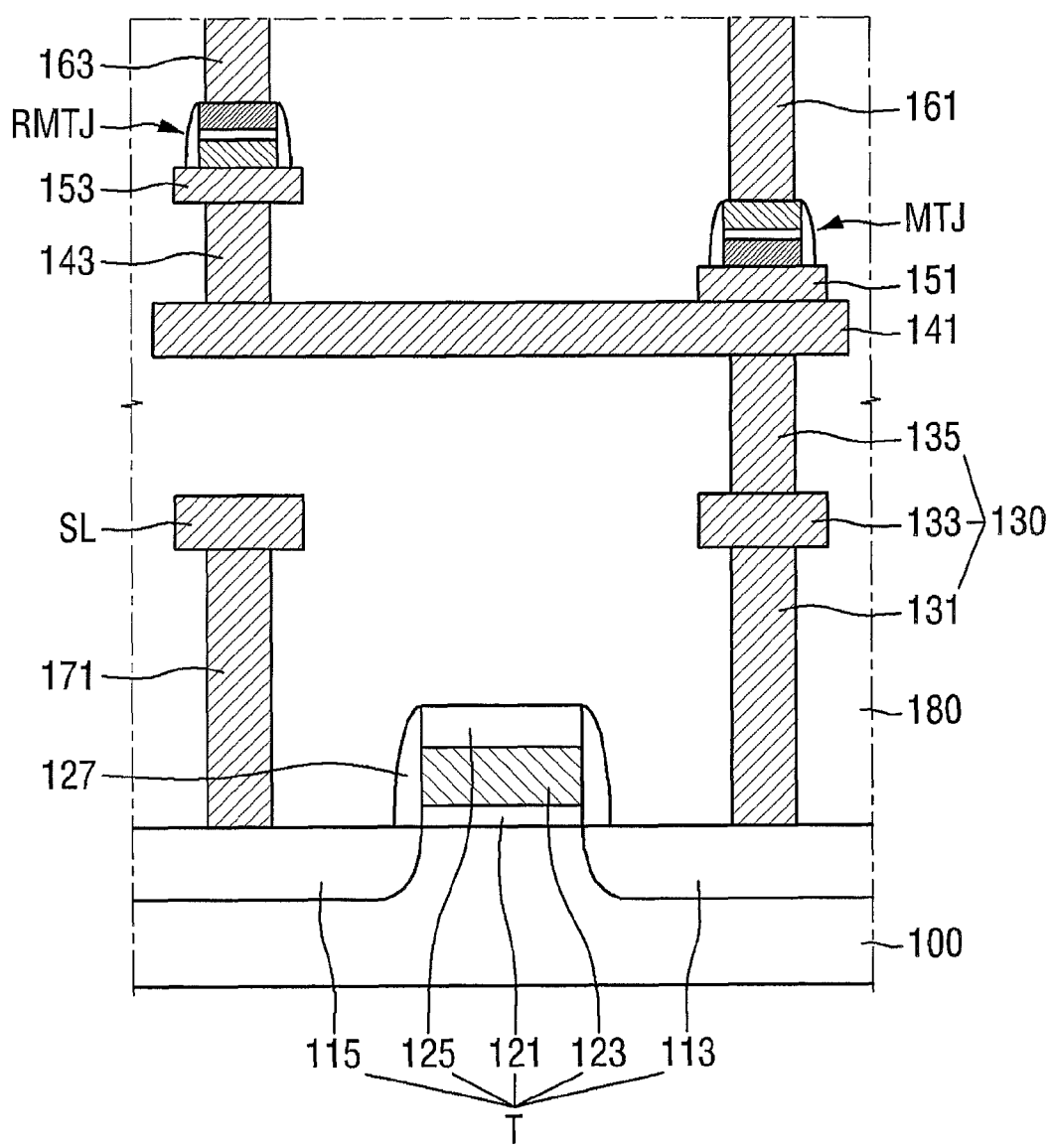
FIG. 2 is a cross-sectional view of a magnetic memory device 1 according to some embodiments of the present inventive concepts.
Figures 3, 4:
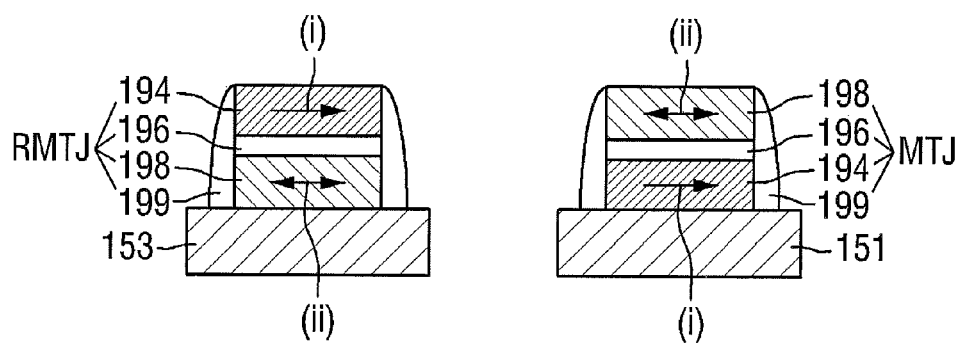
FIG. 3 is a cross-sectional view of first and second magnetic memory cells MTJ and RMTJ according to some embodiments of the present inventive concepts.
FIG. 4 is a table illustrating operating voltages of the magnetic memory device 1 of FIG. 1.

FIG. 1 is an equivalent circuit diagram of a magnetic memory device 1 according to some embodiments of the present inventive concepts, and FIG. 2 is a cross-sectional view of a magnetic memory device 1 according to some embodiments of the present inventive concepts. FIG. 3 is a cross-sectional view of first and second magnetic memory cells MTJ and RMTJ, and FIG. 4 is a table explaining operating voltages of the magnetic memory device 1 of FIG. 1.

Referring to FIG. 1, a magnetic memory device 1 according to some embodiments of the present inventive concepts includes a plurality of word lines WL0 to WLn, a plurality of first and second bit lines BL10 to BL1$m$ and BL20 to BL2$m$, a plurality of source lines SL0 to SLm, and a plurality of first and second memory cells MTJ0 to MTJk and RMTJ0 to RMTJk.

The plurality of word lines WL0 to WLn may cross the plurality of first and second bit lines BL10 to BL1$m$ and BL20 to BL2$m$.

The first bit line BL10 and the second bit line BL20 may be adjacently disposed in parallel to each other. The first bit lines BL10 to BL1m and the second bit lines BL20 to BL2m may form pairs, respectively, and may be alternately disposed.

A plurality of transistors T0 to Ti may be respectively connected to the plurality of word lines WL0 to WLn. Specifically, gates of the transistors T0 to Tn may be connected to the word lines WL0 to WLn, respectively, and a plurality of the transistors T may be connected to one of the word lines WL.

The magnetic memory device 1 includes a plurality of first and second magnetic memory cells MTJ0 to MTJk and RMTJ0 to RMTJk that are disposed or arranged in the form of a matrix. One first magnetic memory cell MTJ and one second magnetic memory cell RMTJ may be adjacent to each other, and the first magnetic memory cells MTJ0 to MTJk and the second magnetic memory cells RMTJ0 to RMTJk may be alternately disposed. Since the first magnetic memory cell MTJ and the second magnetic memory cell RMTJ form a pair, the number or quantity of the first magnetic memory cells MTJ0 to MTJk and the second magnetic memory cell RMTJ0 to RMTJk may be equal. The first magnetic memory cells MTJ0 to MTJk may be electrically connected to the second magnetic memory cell RMTJ0 to RMTJk, respectively, and the second magnetic memory cells RMTJ0 to RMTJk may be electrically connected to the second bit lines BL20 to BL2m, respectively.

The plurality of first and second magnetic memory cells MTJ0 to MTJk and RMTJ0 to RMTJk may be disposed in or adjacent cross regions or intersections of the plurality of word lines WL0 to WLn and the plurality of first and second bit lines BL10 to BL1m and BL20 to BL2m. Specifically, the first magnetic memory cells MTJ0 to MTJk may be disposed in cross regions of the word lines WL0 to WLn and the first bit lines BL10 to BL1m, respectively, and the second magnetic memory cells RMTJ0 to RMTJk may be disposed in cross regions of the word lines WL0 to WLn and the second bit lines BL20 to BL2m, respectively. The first magnetic memory cells MTJ0 to MTJk may be electrically connected to the word lines WL0 to WLn and the first bit lines BL10 to BL1m, respectively, and the second magnetic memory cells RMTJ0 to RMTJk may be electrically connected to the word lines WL0 to WLn and the second bit lines BL20 to BL2m, respectively.

In the magnetic memory device 1 according to some embodiments of the present inventive concepts, one first magnetic memory cell MTJ and one second magnetic memory cell RMTJ may share one transistor T. For example, the first magnetic memory cell MTJ0 and the second magnetic memory cell RMTJ0 may be connected to the first transistor T0 that is connected to the first word line WL0.

The plurality of first and second magnetic memory cells MTJ0 to MTJk and RMTJ0 to RMTJk may include a magnetic material, and may have, for example, a magnetic tunnel junction (MTJ) structure. Further, the plurality of first and second magnetic memory cells MTJ0 to MTJk and RMTJ0 to RMTJk may perform memory functions using a STT (Spin Transfer Torque) phenomenon whereby the magnetization direction of the magnetic body is varied by input current. The first magnetic memory cell MTJ and the second magnetic memory cell RMTJ may have different structures, as described in greater detail below.

Two adjacent transistors among the plurality of transistors T0 to Ti share one source line SL. For example, the first transistor T0 and the second transistor T1 share the first source line SL0. Two adjacent transistors T may share one source region 115, and the source line SL may be connected to the source region that is shared by the two transistors T.

The plurality of source lines SL0 to SLm may be connected to a plurality of source regions 115 that are shared by the two transistors T. FIG. 1 illustrates that the plurality of source lines SL0 to SLm are disposed in parallel to the plurality of first and second bit lines BL10 to BL1m and BL20 to BL2m between the plurality of first and second bit lines BL10 to BL1m and BL20 to BL2m, but the present inventive concepts are not limited thereto. For example, the plurality of source lines SL0 to SLm may be disposed in parallel to the plurality of word lines WL0 to WLn.

Referring to FIG. 2, the magnetic memory device 1 may include a substrate 10, a transistor T, and first and second magnetic memory cells MTJ and RMTJ.

The transistor T is disposed on the substrate 10. The transistor T may include a drain region 113, a source region 115, a gate insulating layer 121, a gate electrode 123, and a hard mask 125.

The drain region 113 and the source region 115 may be formed in the substrate 10, and are spaced apart from each other. The drain region 113 and the source region 115 may be formed by doping impurities of an opposite conductivity type to the conductivity type of the substrate 10. A gap portion between the drain region 113 and the source region 115 corresponds to a channel region of the transistor T, the gate insulating layer 121 is formed on the channel region, and the gate electrode 123 is formed on the gate insulating layer 121. The gate electrode 123 may extend to cross an upper portion of the channel region to serve as the word line WL of FIG. 1.

A spacer 127 may be formed on both side walls of the gate electrode 123.

The substrate 100 may be made of bulk silicon or SOI (Silicon-On-Insulator). The substrate 100 may be a silicon substrate, or may include another material, for example, silicon germanium, indium antimonide, lead telluride, indium arsenide, indium phosphide, gallium arsenide, and/or gallium antimonide. Further, the substrate 100 may be provided by forming an epitaxial layer on a base substrate. The gate insulating layer 121 may include, for example, a silicon oxide layer, a silicon oxynitride layer, germanium oxynitride (GexOyNz), germanium silicon oxide (GexSiyOz), a high-k dielectric material, a combination thereof, and/or a stacked layer in which one or more of the above-described materials are successively stacked. The high-k dielectric material may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate, but is not limited thereto. The gate electrode 123 may include metal, such as tungsten (W), aluminum (Al), copper (Cu), titanium (Ti), and/or tantalum (Ta), metal nitride, such as tungsten nitride (WN), titanium nitride (TiN), tantalum nitride (TaN), and/or boron nitride (BN), and/or polysilicon, but is not limited thereto. The hard mask 125 may include, for example, an oxynitride layer and/or a nitride layer. The spacer 127 may include, for example, an oxide layer, an oxynitride layer, and/or a nitride layer.

On a drain region 113 of the transistor T, a first vertical contact plug 130 contacts the drain region 113. The first vertical contact plug 130 may be formed to extend in a first direction (e.g., vertical direction). The first vertical contact plug 130 may include a first contact 131 that comes in contact with the drain region 113, a second contact 135, and a first contact pad 133 connecting the first contact 131 and the second contact 135 to each other. The first contact pad 133 may be formed with substantially the same height as the source line SL.

FIG. 2 illustrates that the first vertical contact plug 130 includes only one contact pad 133, but the present inventive concepts are not limited thereto. As the height at which the first and second magnetic memory cells MTJ and RMTJ are formed on the substrate 100 becomes higher, the number of contact pads and contacts included in the first vertical contact plug 130 may increase.

A horizontal contact plug 141 contacts an upper surface of the first contact plug 130. The horizontal contact plug 141 may extend in a second direction (e.g., horizontal direction) that is different from the first direction. A second vertical contact plug 143 and a first pad 151 may be disposed on the horizontal contact plug 141. The first pad 151 may be disposed on an upper surface of the horizontal contact plug 141. The second vertical contact plug 143 may be disposed to contact the horizontal contact plug 141, and may extend in the first direction (e.g., vertical direction). The first pad 151 and the second vertical contact plug 143 are spaced apart from each other. A second pad 153 is disposed on an upper surface of the second vertical contact plug 143.

The first magnetic memory cell MTJ is disposed on the first pad 151, and the second magnetic memory cell RMTJ is disposed on the second pad 153. Since the structure of the first magnetic memory cell MTJ is different from the structure of the second magnetic memory cell RMTJ, the first and second magnetic memory cells MTJ and RMTJ may not be formed simultaneously. Accordingly, in order to separately form the first magnetic memory cell MTJ and the second magnetic memory cell RMTJ, the first magnetic memory cell MTJ and the second magnetic memory cell RMTJ may be formed at different heights or with different disposal heights. Referring to FIG. 2, the height measured from the substrate 100 to the first magnetic memory cell MTJ may be lower than the height measured from the substrate 100 to the second magnetic memory cell RMTJ. However, the present inventive concepts are not limited thereto. For example, the second magnetic memory cell RMTJ may be formed to be lower than the first magnetic memory cell MTJ. In this case, the first magnetic memory cell MTJ may be disposed on the upper surface of the second pad 153, and the second magnetic memory cell RMTJ may be disposed on the upper surface of the first pad 151.

Third vertical contact plugs 161 and 163 may be disposed on the first and second magnetic memory cells MTJ and RMTJ, respectively. Through the third vertical contact plugs 161 and 163, the first magnetic memory cell MTJ may be electrically connected to the first bit line BL1, and the second magnetic memory cell RMTJ may be electrically connected to the second bit line BL2. In other words, the first magnetic memory cell MTJ is connected to the first bit line BL1 and the drain region 113 of the transistor T, and the second magnetic memory cell RMTJ is connected to the second bit line BL2 and the drain region 113 of the transistor T.

A source contact 171 is disposed on the source region 115 of the transistor T, and the source line SL is disposed on an upper surface of the source contact 171. The source contact 171 may electrically connect the source region 115 and the source line SL to each other. As a result, if a voltage is applied to the gate electrode 123, electrical connection is made from the source line SL to the first bit line BL1 through the first magnetic memory cell MTJ, and electrical connection is made from the source line SL to the second bit line BL2 through the second magnetic memory cell RMTJ.

The source contact 171 and the first contact 131 are formed at the same level. Here, the term "the same level" may refer to formation through the same fabricating process. Further, the source line SL and the first contact pad 133 may be formed at the same level.

The first vertical contact plug 130, the horizontal contact plug 141, the second vertical contact plug 143, the third vertical contact plugs 161 and 163, the first and second pads 151 and 153, the source contact 171, and/or the source line SL may include a conductive material, for example, W, Cu, and/or Al.

Referring to FIG. 3, the structures of the first and second magnetic memory cells MTJ and RMTJ will be described.

Referring to FIG. 3, each of the first magnetic memory cell MTJ and the second magnetic memory cell RMTJ may include a first magnetic layer 194, a tunnel insulating layer 196, and a second magnetic layer 198. The first magnetic memory cell MTJ may be formed by successively stacking the first magnetic layer 194, the tunnel insulating layer 196, and the second magnetic layer 198 on the first pad 151. In contrast, the second magnetic memory cell RMTJ may be formed by successively stacking the second magnetic layer 198, the tunnel insulating layer 196, and the first magnetic layer 194 on the second pad 153. That is, the stacking order of the first magnetic memory cell MTJ may be different from the stacking order of the second magnetic memory cell RMTJ. Accordingly, the first magnetic memory cell MTJ and the second magnetic memory cell RMTJ may consistently or always operate in the opposite manner.

The first magnetic layer 194 may have a magnetization direction i that is fixed or "pinned" to one direction regardless of current, and the second magnetic layer 198 may have a magnetization direction ii that is changeable or "free" and can be varied by a write current. The magnetization direction ii of the second magnetic layer 198 may be in parallel to or in semi-parallel to the magnetization direction i of the first magnetic layer 194. The first magnetic layer 194 may also be referred to herein as a pinned magnetic layer, and the second magnetic layer 198 may also be referred to herein as a free magnetic layer.

If the direction of current is from the second magnetic layer 198 to the first magnetic layer 194, the magnetization direction i of the first magnetic layer 194 may be different from the magnetization direction ii of the second magnetic layer 198. In such a magnetization state, the first and second magnetic memory cells MTJ and RMTJ may have a high resistance state and may store data (e.g., binary data) of a first value (e.g., "0"). If the direction of current is from the first magnetic layer 194 to the second magnetic layer 198, the magnetization direction i of the first magnetic layer 194 may be the same as the magnetization direction ii of the second magnetic layer 198. In such a magnetization state, the first and second magnetic memory cells MTJ and RMTJ may have a low resistance state and may store data (e.g., binary data) of a second value (e.g., "1").

The first and second magnetic layers 194 and 198 may include a ferromagnetic material. The first magnetic layer 194 may further include an anti-ferromagnetic material that pins the magnetization direction of the ferromagnetic material in the first magnetic layer 194.

The tunnel insulating layer 196 may be disposed between the first magnetic layer 194 and the second magnetic layer 198. The tunnel insulating layer 196 may change the magnetization direction ii of the second magnetic layer 198. The tunnel insulating layer 196 may include, for example, magnesium oxide, titanium oxide, aluminum oxide, magnesium-zinc oxide, and/or magnesium-boron oxide.

A spacer 199 may be formed on side walls of the first magnetic layer 194, the second magnetic layer 198, and the tunnel insulating layer 196.

Referring to FIGS. 1 to 4, the operation of the magnetic memory device 1 according to some embodiments of the present inventive concepts will be described.

Referring to FIG. 4, operating voltages that are provided to the source line SL, the word line WL, and the first and second bit lines BL1 and BL2 during a read or write operation of the magnetic memory device 1 of FIG. 1 are illustrated.

First, a case where a second value (e.g., "1") is written in the magnetic memory device 1 will be described. A voltage of 0V is provided to the plurality of source lines SL, a power supply voltage VDD is provided to the selected word line (e.g., WL0) among the plurality of word lines WL, and a voltage of 0V is provided to the non-selected word lines WL1 to WLn. Further, a write voltage Vwrite is provided to the first and second bit lines (e.g., BL10 and BL20) that are selected among the plurality of first and second bit lines BL1 and BL2, and a voltage of 0V is provided to the non-selected first and second bit lines BL11 to BL1$m$ and BL21 to BL2$m$. The selected first and second bit lines BL10 and BL20 may be selected one by one from the plurality of first bit lines BL10 to BL1$m$ and the plurality of second bit lines BL20 to BL2$m$, and the selected first and second bit lines BL10 and BL20 may be adjacent to each other and may be connected to one transistor T0.

In this case, current may flow from the selected first and second bit lines BL10 and BL20 to the source line SL0 through the first transistor T0. The current flows to the first magnetic memory cell MTJ0 connected to the selected first bit line BL10 and to the second magnetic memory cell RMTJ0 connected to the selected second bit line BL20, and the magnetization direction of the second magnetic layer 198 is changed according to the direction of current. However, since the stacked structure of the first magnetic memory cell MTJ0 is different from the stacked, structure of the second magnetic memory cell RMTJ0, the magnetization direction of the second magnetic layer 198 of the first magnetic memory cell MTJ0 may be different from the magnetization direction of the second magnetic layer 198 of the second magnetic memory cell RMTJ0. For example, the magnetization direction ii of the second magnetic layer 198 may be different from the magnetization direction i of the first magnetic layer 194 in the first magnetic memory cell MTJ0, and the magnetization direction ii of the second magnetic layer 198 may be the same as the magnetization direction i of the first magnetic layer 194 in the second magnetic memory cell RMTJ0. Accordingly, the first magnetic memory cell MTJ0 may have high resistance, and the second magnetic memory cell RMTJ0 may have low resistance. As a result, since the magnetization direction can be changed by simultaneously providing the voltage to the first magnetic memory cell MTJ0 and the second magnetic memory cell RMTJ0, the second value (e.g., "1") can be written in the magnetic memory device 1 at a time. In other words, data can be stored in the first and second memory cells MTJ0 and RMTJ0 at a time.

Next, a case where a first value (e.g., "0") is written in the magnetic memory device 1 will be described. A write voltage Vwrite is provided to the selected source line (e.g., SL0) among the plurality of source lines SL, a voltage of 0V is provided to the non-selected source lines SL1 to SLm, a power supply voltage VDD is provided to the selected word line (e.g., WL0) among the plurality of word lines WL, and a voltage of 0V is provided to the non-selected word lines WL1 to WLn. Further, a voltage of 0V is provided to the plurality of first and second bit lines BL1 and BL2.

In this case, current may flow from the selected source line SL0 to the first and second bit lines (e.g., BL10 and BL20) through the first transistor T0. The current flows to the first magnetic memory cell MTJ0 connected to the first bit line BL10 and to the second magnetic memory cell RMTJ0 connected to the second bit line BL20, and the magnetization direction of the second magnetic layer 198 is changed according to the direction of current. However, since the stacked structure of the first magnetic memory cell MTJ0 is different from the stacked structure of the second magnetic memory cell RMTJ0, the magnetization direction of the second magnetic layer 198 of the first magnetic memory cell MTJ0 may be different from the magnetization direction of the second magnetic layer 198 of the second magnetic memory cell RMTJ0. Accordingly, the first magnetic memory cell MTJ0 may have low resistance, and the second magnetic memory cell RMTJ0 may have high resistance. As a result, since the magnetization direction can be changed through simultaneous providing of the voltage to the first magnetic memory cell MTJ0 and the second magnetic memory cell RMTJ0, the first value (e.g., "0") can be written in the magnetic memory device 1 at a time. In other words, data can be stored in the first and second memory cells MTJ0 and RMTJ0 at a time.

Last, a case where data is read out from the magnetic memory device 1 will be described. A voltage of 0V is provided to the plurality of source lines SL. A power supply voltage VDD is provided to the selected word line (e.g., WL0) among the plurality of word lines WL, and a voltage of 0V is provided to the non-selected word lines WL1 to WLn. Further, a read voltage Vread is provided to the first and second bit lines (e.g., BL10 and BL20) that are selected among the plurality of first and second bit lines BL1 and BL2, and a voltage of 0V is provided to the non-selected first and second bit lines BL11 to BL1$m$ and BL21 to BL2$m$. The selected first and second bit lines BL10 and BL20 may be selected one by one from the plurality of first bit lines BL10 to BL1$m$ and the plurality of second bit lines BL20 to BL2$m$, and the selected first and second bit lines BL10 and BL20 may be adjacent to each other and may be connected to one transistor T0.

In this case, data can be read through measurement of the current that flows from the selected first and second bit lines BL10 and BL20. If the first magnetic memory cell MTJ0 has high resistance and the second magnetic memory cell RMTJ0 has low resistance, the amount of current that flows to the selected first bit line BL10 is smaller than the amount of current that flows to the second bit line BL20, and thus the second value (e.g., "1") can be read. If the first magnetic memory cell MTJ0 has low resistance and the second magnetic memory cell RMTJ0 has high resistance, the amount of current that flows to the selected first bit line BL10 is larger than the amount of current that flows to the second bit line BL20, and thus the first value (e.g., "0") can be read. As described above, the data can be read through comparison of current flowing to the first magnetic memory cell MTJ0 with current flowing to the second magnetic memory cell RMTJ0 (and/or the relative resistances indicated thereby).

As the first magnetic memory cell MTJ0 and the second magnetic memory cell RMTJ0 have different stacking orders, the respective magnetization directions of the free layers 198 can be changed at a same time so that the resistance of the first magnetic memory cell MTJ0 becomes different from the resistance of the second magnetic memory cell RMTJ0, and thus the data can be written in the magnetic memory device 1 at higher speed. Since the first magnetic memory cell MTJ0 and the second magnetic memory cell RMTJ0 have stacking structures that are opposite to each other, the respective magnetization directions thereof are always or consistently different from each other.

Figure 5:
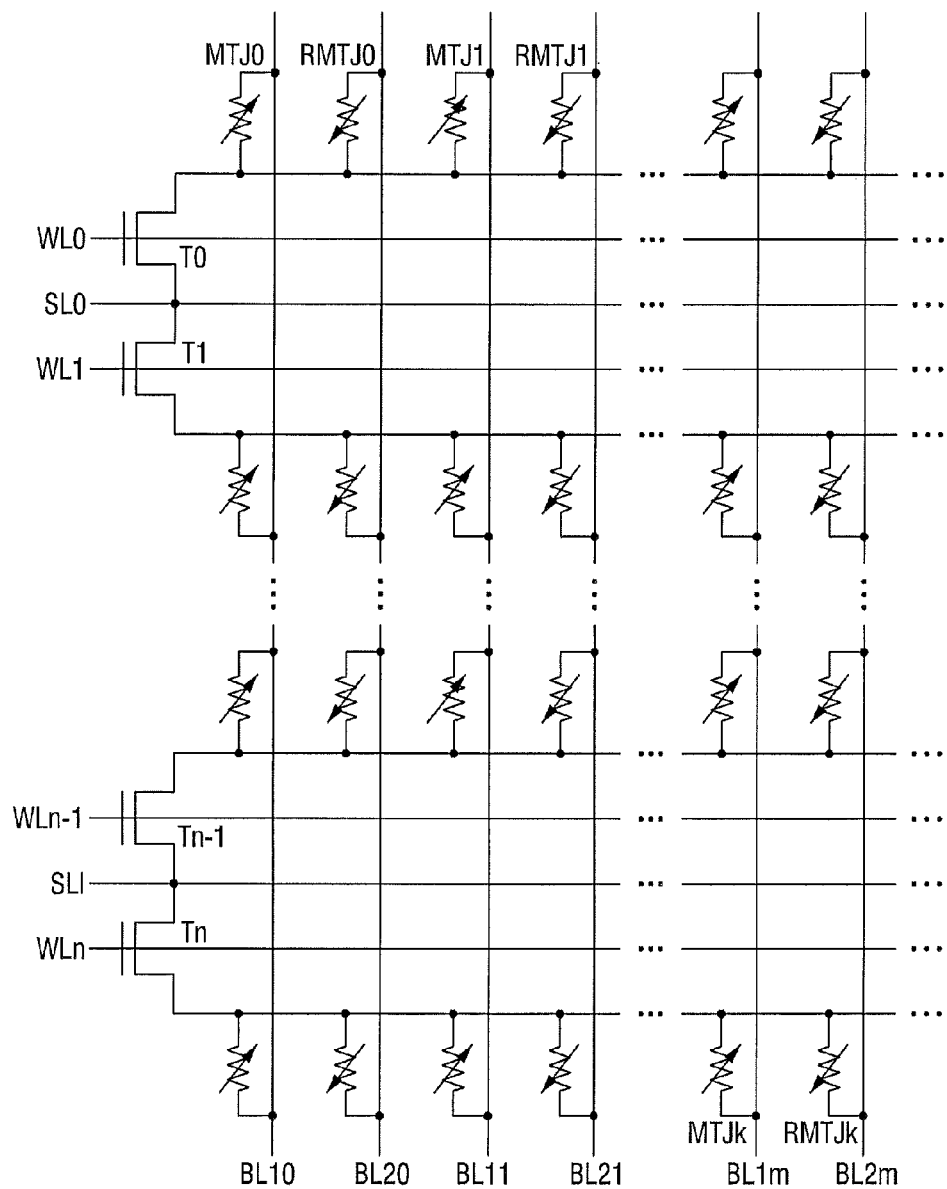
FIG. 5 is an equivalent circuit diagram of a magnetic memory device 2 according to further embodiments of the present inventive concepts.
Figure 6:
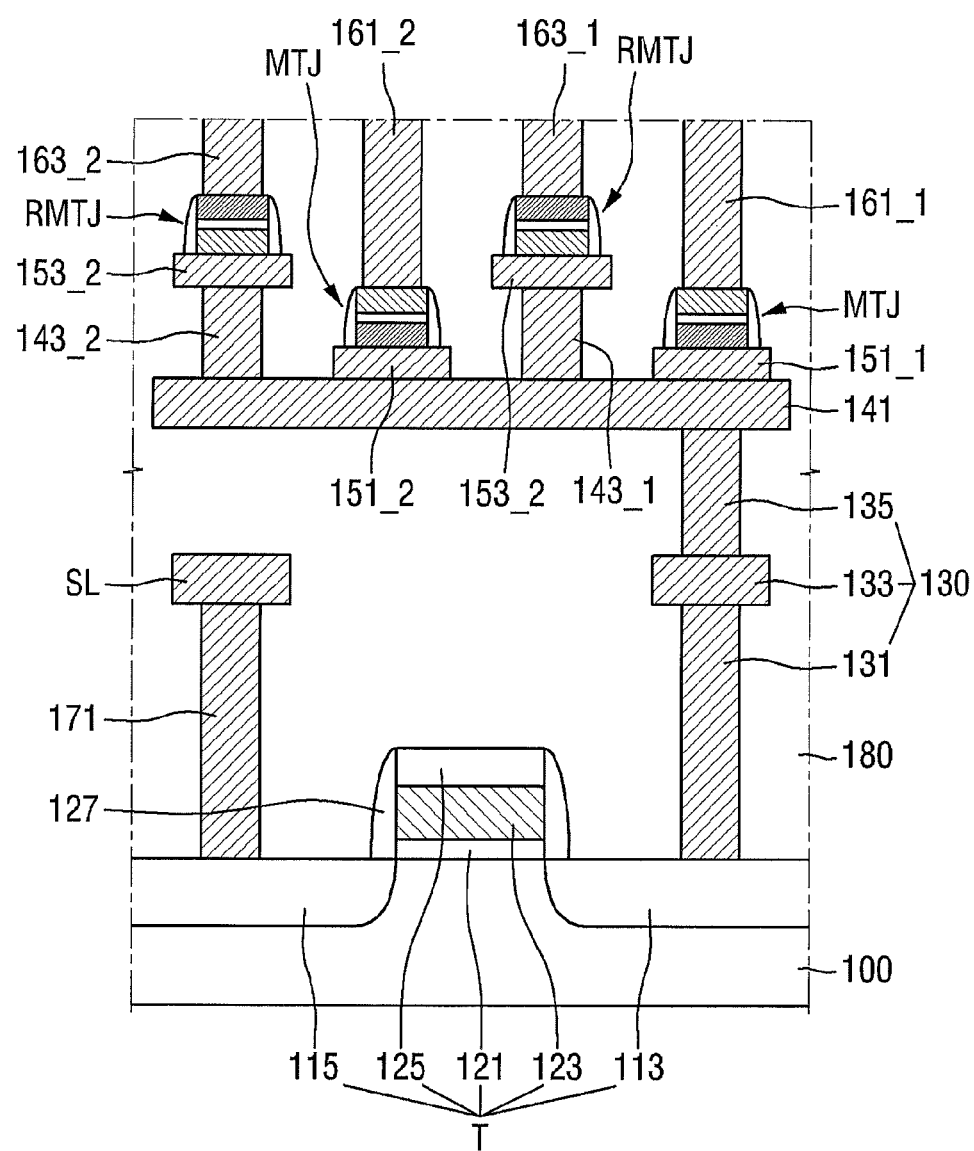
FIG. 6 is a cross-sectional view of a magnetic memory device 2 according to further embodiments of the present inventive concepts.

Referring to FIGS. 5 to 7, a magnetic memory device 2 according to further embodiments of the present inventive concepts will be described. Explanation of similar or duplicate concepts or elements to those as described above will be omitted, and further explanation will be made based on the differences between the embodiments.

FIG. 5 is an equivalent circuit diagram of a magnetic memory device 2 according to further embodiments of the present inventive concepts, FIG. 6 is a cross-sectional view of a magnetic memory device 2 according to further embodiments of the present inventive concepts, and FIG. 7 is a table explaining operating voltages of the magnetic memory device 2 of FIG. 5.

Referring to FIGS. 5 and 6, a magnetic memory device 2 according to further embodiments of the present inventive concepts includes a plurality of first bit lines BL10 to BL1m, a plurality of second bit lines BL20 to BL2m, a plurality of word lines WL0 to WLn that cross the plurality of first and second bit lines BL10 to BL1m and BL20 to BL2m, a plurality of source lines SL0 to SU, a plurality of transistors T0 to Ti, and a plurality of first and second memory cells MTJ0 to MTJk and RMTJ0 to RMTJk. One second bit line BL2 and one first bit line BL1 may form a pair and may be adjacent to each other. The plurality of source lines SL0 to SL1 may be disposed between two adjacent word lines among the plurality of word lines WL0 to WLn.

In the magnetic memory device 1 of FIG. 1, one first magnetic memory cell MTJ and one second magnetic memory cell RMTJ (i.e., a pair of the first and second memory cells) share one transistor T. However, in the magnetic memory device 2 of FIG. 5, a plurality or multiple pairs of the first and second magnetic memory cells MTJ and RMTJ may share one transistor T. For example, referring to FIG. 5, the first transistor T0 may be electrically connected to a plurality of first magnetic memory cells MTJ and a plurality of second magnetic memory cells RMTJ. The number or quantity of the first magnetic memory cells MTJ and the number or quantity of the second magnetic memory cells RMTJ, which share the first transistor T0, may be equal to each other. One first magnetic memory cell MTJ and one second magnetic memory cell RMTJ that is adjacent to the first magnetic memory cell MTJ can simultaneously write and/or read data.

Since one transistor T is electrically connected to a plurality of first and second magnetic memory cells MTJ and RMTJ, a smaller number or quantity of the transistors T than the number or quantity of the transistors in the magnetic memory device 1 of FIG. 1 may be used. Accordingly, the magnetic memory device 2 of FIG. 5 may offer higher integration.

Referring to FIG. 6, the magnetic memory device 2 of FIG. 5 has a different number/quantity of first and second magnetic memory cells MTJ and RMTJ that are electrically connected to the drain region 113 of the transistor T as compared with the magnetic memory device 1 of FIG. 1. Specifically, a plurality of first pads 151_1 and 151_2 and a plurality of second vertical contact plugs 143_1 and 143_2 are disposed on a horizontal contact plug 141. On the plurality of first pads 151_1 and 151_2, the plurality of first magnetic memory cells MTJ are disposed one by one (that is, one MTJ on each pad 151). Further, the plurality of second pads 153_1 and 153_2 are disposed on the plurality of second vertical contact plugs 143_1 and 143_2, and the plurality of second magnetic memory cells RMTJ are disposed one by one on the plurality of second pads 153_1 and 153_2 (that is, one RMTJ on each pad 153). FIG. 6 illustrates two first magnetic memory cells MTJ and two second magnetic memory cells RMTJ, but the present inventive concepts are not limited thereto. Three or more first magnetic memory cells MTJ and RMTJ and three or more second magnetic memory cells MTJ and RMTJ may be electrically connected to one drain region 113 in some embodiments.

The height measured from the substrate 100 to the first magnetic memory cell MTJ may be different from the height measured from the substrate 100 to the second magnetic memory cell RMTJ. FIG. 6 illustrates that the second magnetic memory cell RMTJ is formed to be higher than the first magnetic memory cell MTJ, but the present inventive concepts are not limited thereto. The first magnetic memory cell MTJ may be formed to be higher than the second magnetic memory cell RMTJ. The heights of the plurality of first magnetic memory cells MTJ may be substantially equal to each other, and the heights of the plurality of second magnetic memory cells RMTJ may be substantially equal to each other.

Through third vertical contact plugs 161_1, 161_2, 163_1, and 163_2, the first magnetic memory cell MTJ may be electrically connected to the first bit line BL1, and the second magnetic memory cell RMTJ may be electrically connected to the second bit lines BL2.

Since the structures of the first and second magnetic memory cells MTJ and RMTJ are the same as or similar to those in FIG. 3, detailed explanation thereof will not be repeated for brevity.

Operation of the magnetic memory device 2 of FIG. 5 will be described below with reference to FIG. 7.

Referring to FIG. 7, operating voltages that are provided to the source line SL, the word line WL, and the first and second bit lines BL1 and BL2 during a read or write operation of the magnetic memory device 2 of FIG. 5 are illustrated.

First, a case where a second value (e.g., "1") is written in the magnetic memory device 2 will be described. A voltage of 0V is provided to the plurality of source lines SL, a power supply voltage VDD is provided to the selected word line (e.g., WL0) among the plurality of word lines WL, and a voltage of 0V is provided to the non-selected word lines WL1 to WLn. Further, a write voltage Vwrite is provided to the first and second bit lines (e.g., BL10 and BL20) that are selected among the plurality of first and second bit lines BL1 and BL2, and a floating voltage Vfloat is provided to the non-selected first and second bit lines BL11 to BL1m and BL21 to BL2m. For example, the floating voltage Vfloat may be higher than the write voltage Vwrite, but the present inventive concepts are not limited thereto. According to embodiments, the floating voltage Vfloat may be lower than the write voltage Vwrite.

The selected first and second bit lines BL10 and BL20 may be selected one by one from the plurality of first bit lines BL10 to BL1m and the plurality of second bit lines BL20 to BL2m, and the selected first and second bit lines BL10 and BL20 may be adjacent to each other and may be connected to one/the same transistor T0.

In this case, current may flow from the selected first and second bit lines BL10 and BL20 to the source line SL0 through the first transistor T0. The current flows to the first magnetic memory cell MTJ0 connected to the selected first bit line BL10 and to the second magnetic memory cell RMTJ0 connected to the selected second bit line BL20, and the magnetization direction of the second magnetic layer 198 is changed according to the direction of current. However, since the stacked structure of the first magnetic memory cell MTJ0 is different from the stacked structure of the second magnetic memory cell RMTJ0, the magnetization direction of the second magnetic layer 198 of the first magnetic memory cell MTJ0 may be different from the magnetization direction of the second magnetic layer 198 of the second magnetic memory cell RMTJ0. Accordingly, the first magnetic memory cell MTJ0 may have high resistance, and the second magnetic memory cell RMTJ0 may have low resistance. As a result, since the magnetization direction can be changed through simultaneously providing the voltage to the first magnetic memory cell MTJ0 and the second magnetic memory cell RMTJ0, the second value (e.g., "1") can be written in the magnetic memory device 1 at a time. In other words, data can be stored in the first and second memory cells MTJ0 and RMTJ0 at a time.

Next, a case where a first value (e.g., "0") is written in the magnetic memory device 1 will be described. A write voltage Vwrite is provided to the selected source line (e.g., SL0) among the plurality of source lines SL, a voltage of 0V is provided to the non-selected source lines SL1 to SLm, a power supply voltage VDD is provided to the selected word line (e.g., WL0) among the plurality of word lines WL, and a voltage of 0V is provided to the non-selected word lines WL1 to WLn. Further, a voltage of 0V is provided to the selected first and second bit lines (e.g., BL10 and BL20) among the plurality of first and second bit lines BL1 and BL2, and a floating voltage Vfloat is provided to the non-selected first and second bit lines BL11 to BL1m and BL21 to BL2m.

In this case, current may flow from the selected source line SL0 to the first and second bit lines (e.g., BL10 and BL20) through the first transistor T0. The current flows to the first magnetic memory cell MTJ0 connected to the selected first bit line BL10 and to the second magnetic memory cell RMTJ0 connected to the selected second bit line BL20, and the magnetization direction of the second magnetic layer 198 is changed according to the direction of current. However, since the stacked structure of the first magnetic memory cell MTJ0 is different from the stacked structure of the second magnetic memory cell RMTJ0, the magnetization direction of the second magnetic layer 198 of the first magnetic memory cell MTJ0 may be different from the magnetization direction of the second magnetic layer 198 of the second magnetic memory cell RMTJ0. Accordingly, the first magnetic memory cell MTJ0 may have low resistance, and the second magnetic memory cell RMTJ0 may have high resistance. As a result, since the magnetization direction can be changed through simultaneously providing the voltage to the first magnetic memory cell MTJ0 and the second magnetic memory cell RMTJ0, the first value (e.g., "0") can be written in the magnetic memory device 1 at a time. In other words, data can be stored in the first and second memory cells MTJ0 and RMTJ0 at a time.

Last, a case where data is read out from the magnetic memory device 2 will be described. A voltage of 0V is provided to the plurality of source lines SL. A power supply voltage VDD is provided to the selected word line (e.g., WL0) among the plurality of word lines WL, and a voltage of 0V is provided to the non-selected word lines WL1 to WLn. Further, a read voltage Vread is provided to the first and second bit lines (e.g., BL10 and BL20) that are selected among the plurality of first and second bit lines BL1 and BL2, and a voltage of 0V is provided to the non-selected first and second bit lines BL11 to BL1m and BL21 to BL2m. The selected first and second bit lines BL10 and BL20 may be selected one by one from the plurality of first bit lines BL10 to BL1m and the plurality of second bit lines BL20 to BL2m, and the selected first and second bit lines BL10 and BL20 may be adjacent to each other and may be connected to one/the same transistor T0.

In this case, data can be read through measurement of the current that flows from the selected first and second bit lines BL10 and BL20. If the first magnetic memory cell MTJ0 has high resistance and the second magnetic memory cell RMTJ0 has low resistance, the amount of current that flows to the selected first bit line BL10 is smaller than the amount of current that flows to the second bit line BL20, and thus the second value can be read. If the first magnetic memory cell MTJ0 has low resistance and the second magnetic memory cell RMTJ0 has high resistance, the amount of current that flows to the selected first bit line BL10 is larger than the amount of current that flows to the second bit line BL20, and thus the first value can be read. As described above, the data can be read through comparison of current flowing to the first magnetic memory cell MTJ0 with current flowing to the second magnetic memory cell RMTJ0.

Figure 8:
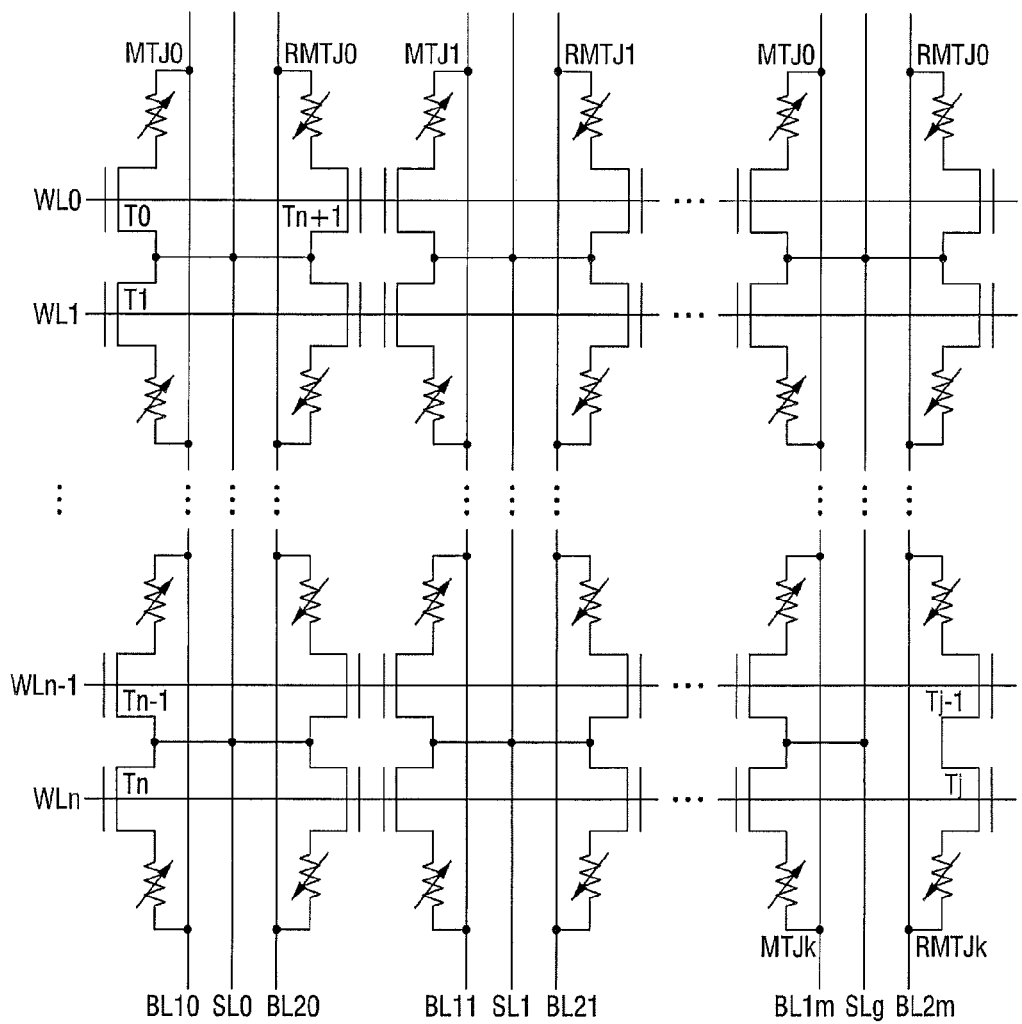
FIG. 8 is an equivalent circuit diagram of a magnetic memory device 3 according to still further embodiments of the present inventive concepts.
Figure 9:
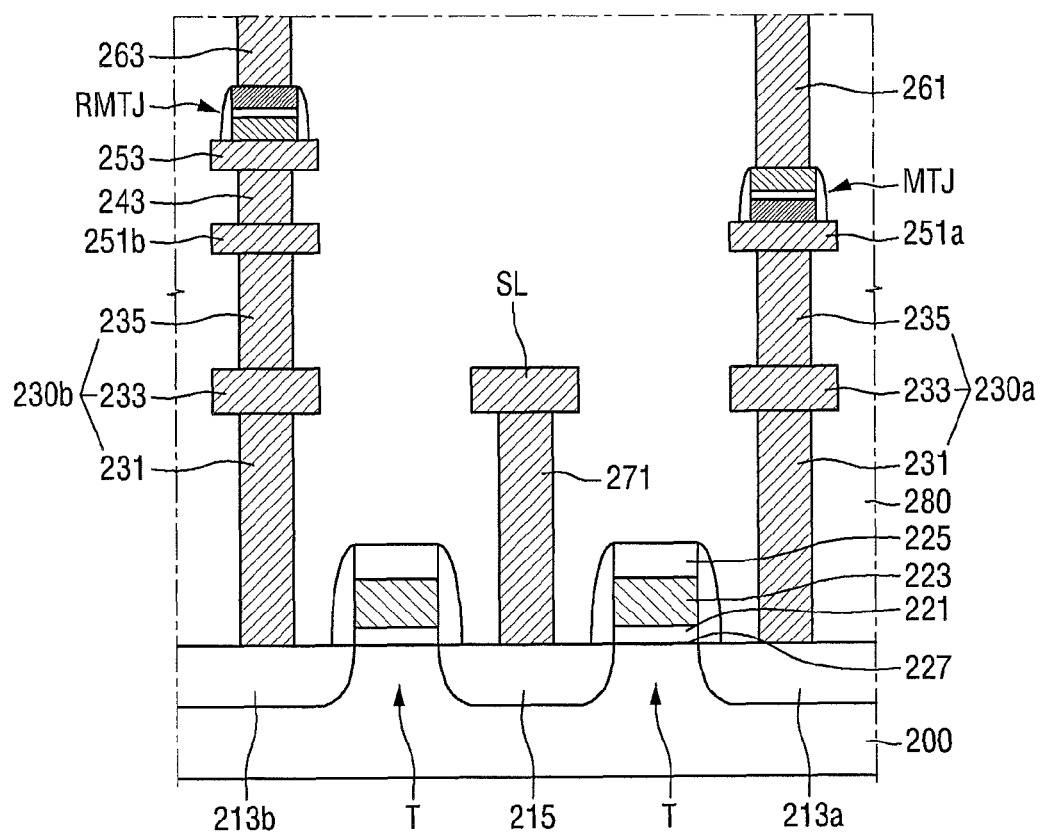
FIG. 9 is a cross-sectional view of a magnetic memory device 3 according to still further embodiments of the present inventive concepts.

Referring to FIGS. 8 and 9, a magnetic memory device 3 according to still further embodiments of the present inventive concepts will be described. Explanation of concepts and/or elements similar to those as described above will not be repeated for brevity, and explanation will focus on the different points between the embodiments.

FIG. 8 is an equivalent circuit diagram of a magnetic memory device 3 according to still further embodiments of the present inventive concepts, and FIG. 9 is a cross-sectional view of a magnetic memory device 3 according to still further embodiments of the present inventive concepts.

Referring to FIGS. 8 and 9, a magnetic memory device 3 of FIG. 8 includes a plurality of first bit lines BL10 to BL1m, a plurality of second bit lines BL20 to BL2m, a plurality of source lines SL0 to SLg, a plurality of word lines WL0 to WLn that cross the plurality of first and second bit lines BL10 to BL1m and BL20 to BL2m, a plurality of transistors T0 to Tj, and a plurality of first and second memory cells MTJ0 to MTJk and RMTJ0 to RMTJk. One second bit line BL2 and one first bit line BL1 may form or define a pair and may be adjacent to each other. FIG. 8 illustrates that the plurality of source lines SL0 to SLg are disposed between the first bit line BL1 and the second bit line BL2, but embodiments described herein are not limited thereto. For example, the plurality of source lines LS0 to SLg may be disposed between two adjacent word lines WL0 and WL1 among the plurality of word lines WL0 to WLn.

In the magnetic memory device 1 of FIG. 1, one first magnetic memory cell MTJ and one second magnetic memory cell RMTJ share one transistor T. However, in the magnetic memory device 3 of FIG. 8, one transistor T may be connected to one magnetic memory cell. In other words, respective transistors T may be connected to the first magnetic memory cell MTJ and the second magnetic memory cell RMTJ. For example, referring to FIG. 8, the first transistor T0 and the (n+1)-th transistor Tn+1 may be respectively connected to the first word line WL0, the first magnetic memory cell MTJ0 may be connected to the first transistor T0, and the second magnetic memory cell RMTJ0 may be connected to the (n+1)-th transistor Tn+1. The first transistor T0 and the (n+1)-th transistor Tn+1 are connected to the first word line WL0 to operate together, and thus the first magnetic memory cell MTJ0 and the second magnetic memory cell RMTJ0 may be simultaneously written and/or read.

Referring to FIG. 9, the magnetic memory device 3 of FIG. 8 may include a plurality of transistors T, first vertical contact plugs 230a and 230b, first and second magnetic memory cells MTJ and RMTJ, a second vertical contact plug 243, and third vertical contact plugs 261 and 263. Two adjacent transistors T may include drain regions 213a and 213b, respectively, and may share one source region 215. A source contact 271 is disposed on the source region 215, and a source line SL is disposed on the source contact 271. The source contact 271 may electrically connect the source region 215 and the source line SL to each other.

The transistor T may include a gate insulating layer 221, a gate electrode 223, and a hard mask 225, and the gate electrode 223 extends to cross an upper portion of the channel region to serve as the word line WL of FIG. 8, as similarly described in detail above.

The first vertical contact plugs 230a and 230b may be formed on the drain regions 213a and 213b, respectively. The first vertical contact plugs 230a and 230b may extend in the first direction, and may each include a first contact 231, a second contact 235, and a first contact pad 233 that connects the first contact 231 and the second contact 235 to each other. The first contact pad 233 may be formed with substantially the same height as the source line SL.

First pads 251a and 251b may be deposited on upper surfaces of the first vertical contact plugs 230a and 230b, and the first magnetic memory cell MTJ may be deposited on an upper surface of one first pad 251a. The second vertical contact plug 243 is deposited on an upper surface of the other first pad 251b. A second pad 253 is deposited on an upper surface of the second vertical contact plug 243, and the second magnetic memory cell RMTJ is deposited on an upper surface of the second pad 253. Since the structures of the first and second magnetic memory cells MTJ and RMTJ have been described in detail above with reference to FIG. 3, further explanation thereof will not be repeated for brevity.

The height measured from the substrate 100 to the first magnetic memory cell MTJ may be different from the height measured from the substrate 100 to the second magnetic memory cell RMTJ. FIG. 9 illustrates that the second magnetic memory cell RMTJ is formed to be higher than the first magnetic memory cell MTJ, but the present inventive concepts are not limited thereto. The first magnetic memory cell MTJ may be formed to be higher than the second magnetic memory cell RMTJ in some embodiments.

Through the third vertical contact plugs 261 and 263, the first magnetic memory cell MTJ and the second magnetic memory cell RMTJ may be electrically connected to the first bit line BL1, and the second magnetic memory cell RMTJ may be electrically connected to the second bit lines BL2.

The magnetic memory device 3 of FIG. 8 may operate in the same manner as the magnetic memory device 1 of FIG. 1. Accordingly, by applying the voltages in the same manner as described above with reference to FIGS. 3 and 4, data can be read and/or written in the magnetic memory device 3 of FIG. 8. However, in the magnetic memory device 3 of FIG. 8, one transistor T is connected to either of the first and second magnetic memory cells MTJ and RMTJ, and thus two transistors T operate together to read and/or write data in the first and second magnetic memory cells MTJ and RMTJ. For example, in the case of reading and/or writing the data in the first and second magnetic memory cells (e.g., MTJ0 and RMTJ0), the first transistor T0 and the (n+1)-th transistor Tn+1 operate through applying of the power supply voltage VDD to the first word line WL0. Current may flow between the first bit line BL10 and the first source line SL0 and between the second bit line BL20 and the first source line SL0.

Figure 10:
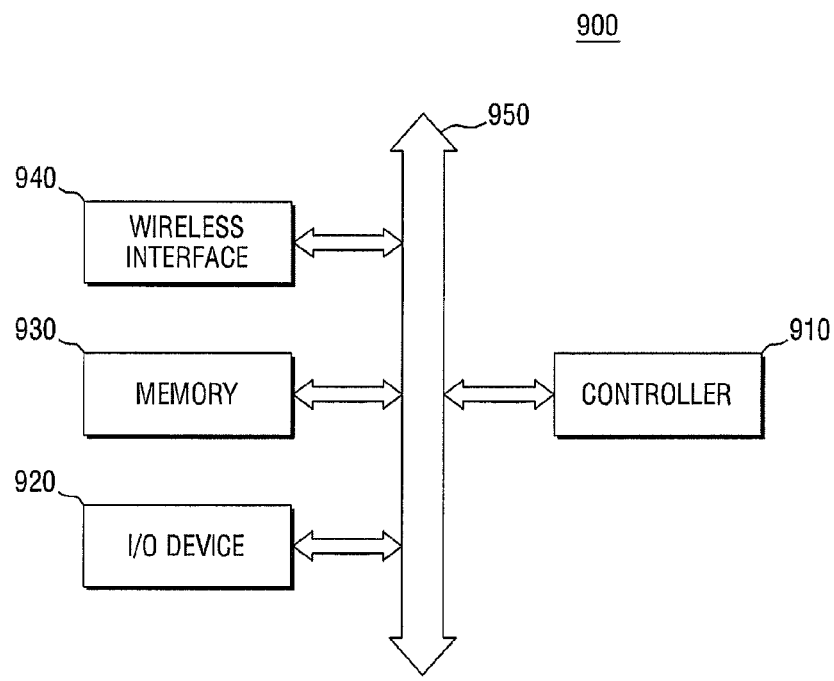
FIG. 10 is a block diagram schematically illustrating a system including the magnetic memory devices 1 to 3 according to embodiments of the present inventive concepts.

FIG. 10 is a block diagram schematically illustrating a system including one or more of the magnetic memory devices 1 to 3 according to some embodiments of the present inventive concepts.

Referring to FIG. 10, a system 900 according to this embodiment may be used in wireless communication devices, for example, a PDA, a laptop computer, a portable computer, a web tablet, a wireless phone, a cellular phone, a digital music player, and/or other devices that can transmit and/or receive information in wireless communication environments.

The system 900 may include a controller 910, an input/output (I/O) device 920, such as a keypad, a keyboard, or a display, a memory 930, and a wireless interface 940 that communicate via bus 950. The controller 910 may include at least one microprocessor, a digital signal processor, a microcontroller, and/or a similar processor. The memory 930 may be used to store commands executed by the controller 910. Further, the memory 930 may be used to store user data. The memory 930 may include one or more of the magnetic memory devices 1 to 3 according to some embodiments of the present inventive concepts. The memory 930 may further include different kinds of memories, such as volatile memories that can be optionally accessed at any time, and/or other various kinds of memories.

The system 900 may use the wireless interface 940 in order to transmit and/or receive data through a wireless communication network communicating with RF signals. For example, the wireless interface 940 may include an antenna and/or a wireless transceiver.

The system 900 according to some embodiments of the present inventive concepts may use a communication interface protocol, such as CDMA (Code Division Multiple Access), GSM (Global System for Mobile Communication), NADC (North American Digital Cellular), TDMA (Time Division Multiple Access), E-TDMA (Extended Time Division Multiple Access), WCDMA (Wideband Code Division Multiple Access), or CDMA2000.

Figure 11:
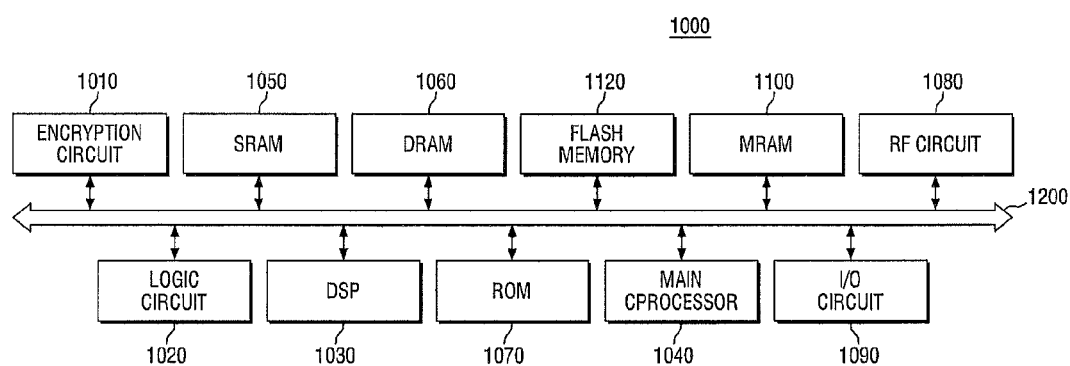
FIG. 11 is a block diagram illustrating a configuration of a memory card to which the magnetic memory devices 1 to 3 according to embodiments of the present inventive concepts are applied.

FIG. 11 is a block diagram illustrating the configuration of a memory card to which the magnetic memory devices 1 to 3 according to some embodiments of the present inventive concepts can be applied.

Referring to FIG. 11, a memory card 1000 according to some embodiments of the present inventive concepts may include an encryption circuit 1010 for encryption, a logic circuit 1020, a digital signal processor (DSP) 1030 that is a dedicated processor, and a main processor 1040. Further, the memory card 1000 may include a nonvolatile memory device 1100 including at least one of the magnetic memory devices 1 to 3 according to embodiments of the present inventive concepts, and/or other various kinds of memories, for example, SRAM 1050, DRAM 1060, ROM 1070, and flash memory 1120. Further, the memory card 1000 may include an RF (high frequency/microwave) circuit 1080 and an I/O circuit 1090. Function blocks 1010 to 1120 provided in the memory card 1000 may be connected to each other through a system bus 1200. The memory card 1000 operates under the control of an external host, and the nonvolatile memory device 1100 according to some embodiments of the present inventive concepts may function to store or output data under the control of the host.

Although preferred embodiments of the present inventive concepts have been described for illustrative purposes, those skilled in the art will appreciate that various modifications, additions and substitutions are possible, without departing from the scope and spirit of the inventive concepts as disclosed in the accompanying claims.

What is claimed is:
1. A magnetic memory device comprising:
 a first bit line and a second bit line that is adjacent the first bit line;
 a first word line crossing the first and second bit lines;

a first magnetic memory cell disposed adjacent an intersection of the first bit line and the first word line; and
a second magnetic memory cell disposed adjacent an intersection of the second bit line and the first word line,
wherein the first and second magnetic memory cells respectively include a first magnetic layer, a tunnel insulating layer, and a second magnetic layer, and
wherein respective stacking orders of the first magnetic layer, the tunnel insulating layer, and the second magnetic layer are different in the first and second magnetic memory cells, wherein respective distances between the first and second magnetic memory cells and a substrate are different from each other, and wherein the respective distances between the first and second magnetic memory cells and the substrate are greater than a distance between the first word line and the substrate.

2. The magnetic memory device of claim 1, wherein the first magnetic layer, the tunnel insulating layer, and the second magnetic layer are sequentially stacked in the first magnetic memory cell, and wherein the second magnetic layer, the tunnel insulating layer, and the first magnetic layer are sequentially stacked in the second magnetic memory cell.

3. The magnetic memory device of claim 1, further comprising:
a transistor connected to the first word line and a source line,
wherein the first and second magnetic memory cells are connected to a drain region of the transistor, and the source line is connected to a source region of the transistor.

4. The magnetic memory device of claim 3, further comprising:
a first vertical contact plug coming in contact with the drain region and extending in a first direction;
a horizontal contact plug in contact with the first vertical contact plug and extending in a second direction; and
a second vertical contact plug in contact with the horizontal contact plug and extending in the first direction,
wherein the first magnetic memory cell contacts a first pad disposed on an upper surface of the horizontal contact plug, and the second magnetic memory cell contacts a second pad disposed on an upper surface of the second vertical contact plug.

5. The magnetic memory device of claim 3, further comprising:
a plurality of the first word lines; and
a plurality of the first and second magnetic memory cells disposed adjacent respective intersections of the first word lines and the first and second bit lines, respectively.

6. The magnetic memory device of claim 5, wherein a number of the first magnetic memory cells is equal to a number of the second magnetic memory cells.

7. The magnetic memory device of claim 1, further comprising:
first and second transistors respectively connected to the first word line and a source line,
wherein the first and second memory cells are connected to respective drain regions of the first and second transistors, wherein the first and second transistors share a source region, and wherein the source line is connected to the source region.

8. The magnetic memory device of claim 1, wherein a magnetization direction of the first magnetic layer is pinned, and wherein a magnetization direction of the second magnetic layer is changeable.

9. A magnetic memory device comprising:
first and second bit lines that are adjacent one another;
a first word line crossing the first and second bit lines;
a first magnetic memory cell disposed adjacent an intersection of the first bit line and the first word line, the first magnetic memory cell including a first magnetic layer, a tunnel insulating layer, and a second magnetic layer sequentially stacked;
a second magnetic memory cell disposed adjacent an intersection of the second bit line and the first word line, the second magnetic memory cell including a second magnetic layer, a tunnel insulating layer, and a first magnetic layer sequentially stacked; and
a source line electrically connected to the first and second magnetic memory cells,
wherein respective magnetization directions of the second magnetic layer of the first magnetic memory cell and the second magnetic layer of the second magnetic memory cell are different from each other, wherein respective distances between the first and second magnetic memory cells and a substrate are different from each other, and wherein the respective distances between the first and second magnetic memory cells and the substrate are greater than a distance between the first word line and the substrate.

10. The magnetic memory device of claim 9, wherein respective magnetization directions of the first magnetic layer of the first and second magnetic memory cells are pinned, and wherein the respective magnetization directions of the second magnetic layer of the first and second magnetic memory cells are changeable.

11. The magnetic memory device of claim 9, wherein the memory device is configured such that the respective magnetization directions of the second magnetic layer of the first and second magnetic memory cells are different responsive to a same voltage applied to the first and second bit lines.

12. The magnetic memory device of claim 11, wherein the memory device is configured such that, responsive to application of a power supply voltage to the first word line, a first current flows between the first bit line and the source line through the first magnetic memory cell, and a second current flows between the second bit line and the source line through the second magnetic memory cell in a same direction as the first current.

13. The magnetic memory device of claim 9, further comprising:
a transistor connected to the first word line,
wherein the first and second memory cells are connected to a drain region of the transistor, and wherein the source line is connected to a source region of the transistor.

14. A magnetic memory device, comprising:
first and second magnetic memory cells coupled to first and second bit lines, respectively, the first and second magnetic memory cells respectively including a pinned magnetic layer, a free magnetic layer, and a tunnel insulating layer therebetween; and
at least one transistor configured to couple the first and second magnetic memory cells to a common source line,
wherein respective stacking orders of the pinned magnetic layer, the tunnel insulating layer, and the free magnetic layer are different in the first and second magnetic memory cells, wherein respective distances between the first and second magnetic memory cells and a substrate are different from each other, and wherein the respective distances between the first and second magnectic memory cells and the substrate are greater than a distance between the first word line and the substrate.

15. The device of claim 14, wherein the first and second magnetic memory cells have different resistances, and wherein a comparison of the different resistances is indicative of binary data.

16. The device of claim 15, wherein the memory device is configured such that the free magnetic layer of the first magnetic memory cell and the free magnetic layer of the second magnetic memory cell have opposite magnetization directions responsive to application of a same voltage to the first and second bit lines, and the pinned magnetic layer of the first and second magnetic memory cells have a same magnetization direction.

17. The device of claim 14, wherein the at least one transistor comprises a single transistor, wherein the first and second magnetic memory cells are coupled to a drain region of the single transistor and wherein the common source line is coupled to a source region of the single transistor.

18. The device of claim 14, wherein the at least one transistor comprises first and second transistors having a common source region, wherein the first and second magnetic memory cells are coupled to respective drain regions of the first and second transistors, respectively, and wherein the common source line is coupled to the common source region.

\* \* \* \* \*